United States Patent
Caranana

(10) Patent No.: US 6,798,235 B2
(45) Date of Patent: Sep. 28, 2004

(54) BUS CONTROL CIRCUIT

(75) Inventor: Joel Caranana, Polienas (FR)

(73) Assignee: STMicroelectronics S.A., Montrouge (FR)

(*) Notice: Subject to any disclaimer, the term of this patent is extended or adjusted under 35 U.S.C. 154(b) by 0 days.

(21) Appl. No.: 10/237,260

(22) Filed: Sep. 6, 2002

(65) Prior Publication Data
US 2003/0080789 A1 May 1, 2003

(30) Foreign Application Priority Data
Sep. 7, 2001 (FR) .......................................... 01 11567

(51) Int. Cl.[7] .............................................. H03K 17/16
(52) U.S. Cl. .............................. 326/26; 326/27; 326/88; 327/170; 327/108
(58) Field of Search ............................. 326/26, 27, 81, 326/87, 88; 327/108, 110, 391, 374

(56) References Cited

U.S. PATENT DOCUMENTS

| 3,903,431 | A |   | 9/1975  | Heeren ......................... 307/205 |
| 4,761,568 | A |   | 8/1988  | Stronski ........................ 307/269 |
| 5,736,882 | A |   | 4/1998  | Witte ........................... 327/259 |
| 5,973,512 | A | * | 10/1999 | Baker ........................... 326/87  |
| 6,169,428 | B1| * | 1/2001  | Mader .......................... 327/101 |
| 6,194,949 | B1| * | 2/2001  | Hogeboom ................... 327/391 |
| 6,208,174 | B1| * | 3/2001  | Hopkins ....................... 327/65  |
| 6,271,699 | B1| * | 8/2001  | Dowlatabadi ............... 327/170 |

FOREIGN PATENT DOCUMENTS

EP            0 347 083 A2      12/1989

* cited by examiner

Primary Examiner—Vibol Tan
(74) Attorney, Agent, or Firm—Lisa K. Jorgenson; Robert Iannucci; Seed IP Law Group PLLC

(57) ABSTRACT

A bus interface having a first circuit based on a first pair of transistors of opposite types having a control electrode and a common electrode for providing a first output potential. A second circuit has a second pair of transistors of opposite types and having a common electrode for providing a second potential switching in opposite direction from the former. This device has a first capacitive coupling means for feeding a portion of the signal existing at said first potential back into said control electrode of said second transistor pair and second capacitive coupling means for feeding a portion of the signal existing at said second potential back into said control electrodes of said first transistor pair. Thus variations between the rise and decay times of the transistors of each pair can be compensated for.

20 Claims, 2 Drawing Sheets

BUS CONTROL CIRCUIT

BACKGROUND OF THE INVENTION

1. Field of the Invention

The present invention relates to bus control circuits, and more particularly to a bus control circuit including a switching time servo system.

2. Description of the Related Art

Communication systems continuously develop and operation speeds increase constantly. Bus control circuits—also called bus drivers or bus buffers—operate at increasingly higher speeds.

A typical example is provided by the serial interface defined in the CCITT standard, Universal Serial Bus, which is intended to control operation of the serial interface between data processing systems, and in particular between computer devices. In one of the latest versions of this standard—i.e., standard known as USB 2.0—bus control circuits are designed to operate at three different speeds namely, low speed, full speed and high speed. Full speed is considered to be 12 Mbits per seconds and this standard imposes particularly severe constraints in particular regarding switching times of both output circuits (or "buffers") driving the serial cable.

FIG. 1 shows a conventional architecture for such a control circuit comprising a twin control circuit having a low impedance—typically 6 ohms—for example switching to 6 MHz for 50 picoFarads capacitive loads.

A first control circuit or driver 100 is based on a pair of NMOS-PMOS transistors comprised of a PMOS transistor 10 and a NMOS transistor 20, respectively, the drains of these transistors are connected to a common D+ electrode. Each one of transistors 10 and 20 has a coupling capacitor—11 and 21 respectively—which makes it possible to set to an absolute value the rise and decay times of terminal D+ output potential fed by a capacitor $C_{LP}$ 15. A respective current generator, respectively 12 and 22, controls the gates of transistors 10 and 20.

Similarly, the control circuit comprises a second circuit 200 which is also based on a pair of NMOS-PMOS transistors comprised of transistors 30 and 40, controlled by power sources 32 and 42 respectively, and associated with a coupling capacitor, 31 and 41 respectively. The common junction of PMOS transistor 30 and NMOS transistor 40 provides a potential D−, to which a (presumably capacitive) load $C_{LP}$ 35 is connected, and potential D− is supposed to switch exactly contrary to the common potential D+ of transistors 10 and 20.

The assembly of circuits 100 and 200 makes up a twin control structure for a bus. It is however apparent that characteristics of the NMOS and PMOS transistors are difficult to pair to generate virtually identical rise and decay times for potentials D+ and D. Pairing NMOS and PMOS transistors so that they show substantially similar internal characteristics, as is currently done, for example, with resistors or capacitors is one of the great difficulties encountered in manufacturing processes.

BRIEF SUMMARY OF THE INVENTION

An embodiment of this invention provides a solution to the problem of designing a simple structure for a control circuit that allows for compensation of differences between active components, and particularly NMOS and PMOS components, and to appreciably pair the switching times of transistors, in particular their rise and decay times.

An embodiment of the present invention provides a control or interfacing structure for a serial cable having virtually identical rise and decay time values.

An embodiment of the invention is directed to a bus interface circuit that comprises:

a first circuit comprising a first pair of transistors of opposite types having a control electrode and a common electrode for providing a first output potential (D+);

a second circuit comprising a second pair of transistors of opposite types and having a common electrode for providing a second potential (D−) switching in opposite direction from the former;

first capacitive coupling means for feeding a portion of the signal existing at said first potential (D+) back into said control electrodes of said second pair of transistors and, second capacitive coupling means for feeding a portion of the signal existing at said second potential (D−) back into said control electrodes of said first pair of transistors, in order to compensate for the internal characteristics of the transistors and to standardize rise and decay times.

Preferably, coupling will be carried out by cross coupling capacitors and it will then be possible, by simply pairing the capacitors, which is easy to carry out, to compensate for variations of the internal characteristics of the NMOS and PMOS transistors and to obtain identical rise and decay times.

In a preferred embodiment, the first pair of transistors comprises a PMOS-type first transistor, having a source electrode connected to a positive potential (V+) and having a gate that receives a control signal. An NMOS-type second transistor has a source electrode connected to a negative potential (V−) and also has a gate receiving a control signal. Both drain electrodes of the first and second transistors are connected together so as to provide a potential to the output electrode (D+). A first coupling capacitor is respectively connected between the gate and drain of the first transistor and, in the same way, a second coupling capacitor is inserted between the gate and the drain of the second transistor. Cross capacitive coupling is then realized by means of first and second cross coupling capacitors, having one electrode connected to the output (D−) potential of the second control circuit and a second electrode respectively connected to the gate of the first transistor and the gate of the second transistor.

The second circuit comprises a PMOS-type third transistor having a gate and having a source electrode connected to a positive potential (V+). The third transistor is serially assembled to a NMOS-type fourth transistor having a source electrode connected to a negative potential (V−) and having a common drain electrode with the third transistor, this common electrode being connected to the output potential (D−). A NMOS-type fourth transistor has a source electrode connected to a negative potential (V−) and its gate receives a control signal. A third output coupling capacitor is connected between the gate and the drain of the third transistor and, in the same way, a fourth output coupling capacitor is connected between the gate and the drain of the fourth transistor.

Cross capacitive coupling is then realized by means of third and fourth cross coupling capacitors, each having a first electrode connected to the output potential (D+) of the first control circuit and a second electrode that is connected to the gate of the third and the gate of the fourth transistor respectively.

In a preferred embodiment, values of the four cross coupling capacitors $C_1$, $C_2$, $C_3$ and $C_4$ will be set according to the following formulas:

$$C_1 = K \times C_2$$

$$C_3 = C_1$$

$$C_4 = C_2$$

where K corresponds to the ratio of the bias current values in sources 12 and 42 respectively.

Alternatively, a dual structure can be realized in which the first, second, third and fourth transistors are NMOS, PMOS, NMOS and PMOS transistors respectively.

Preferably, the control circuit will be associated with a device for avoiding simultaneous conduction of the transistors of the first and second pairs in order to avoid power overdrain.

In a preferred embodiment, cross coupling capacitors between the first and second circuits will advantageously be realized by means of manufacturing techniques based on capacity arrays

DETAILED DESCRIPTION OF THE INVENTION

A preferred embodiment will now be described which will be used to build an interfacing circuit for a USB-type serial port. It is however obvious that the invention can be used to realize any other high-speed interface circuit. Furthermore, an embodiment of the invention utilizes NMOS transistors having a source electrode connected to ground and PMOS transistors receiving a positive supply voltage, will be described. People qualified in the art will be able to adapt the circuit so as to form a dual structure in which NMOS transistors are connected to the ground and PMOS transistors are supplied with a negative voltage.

Figure 1:
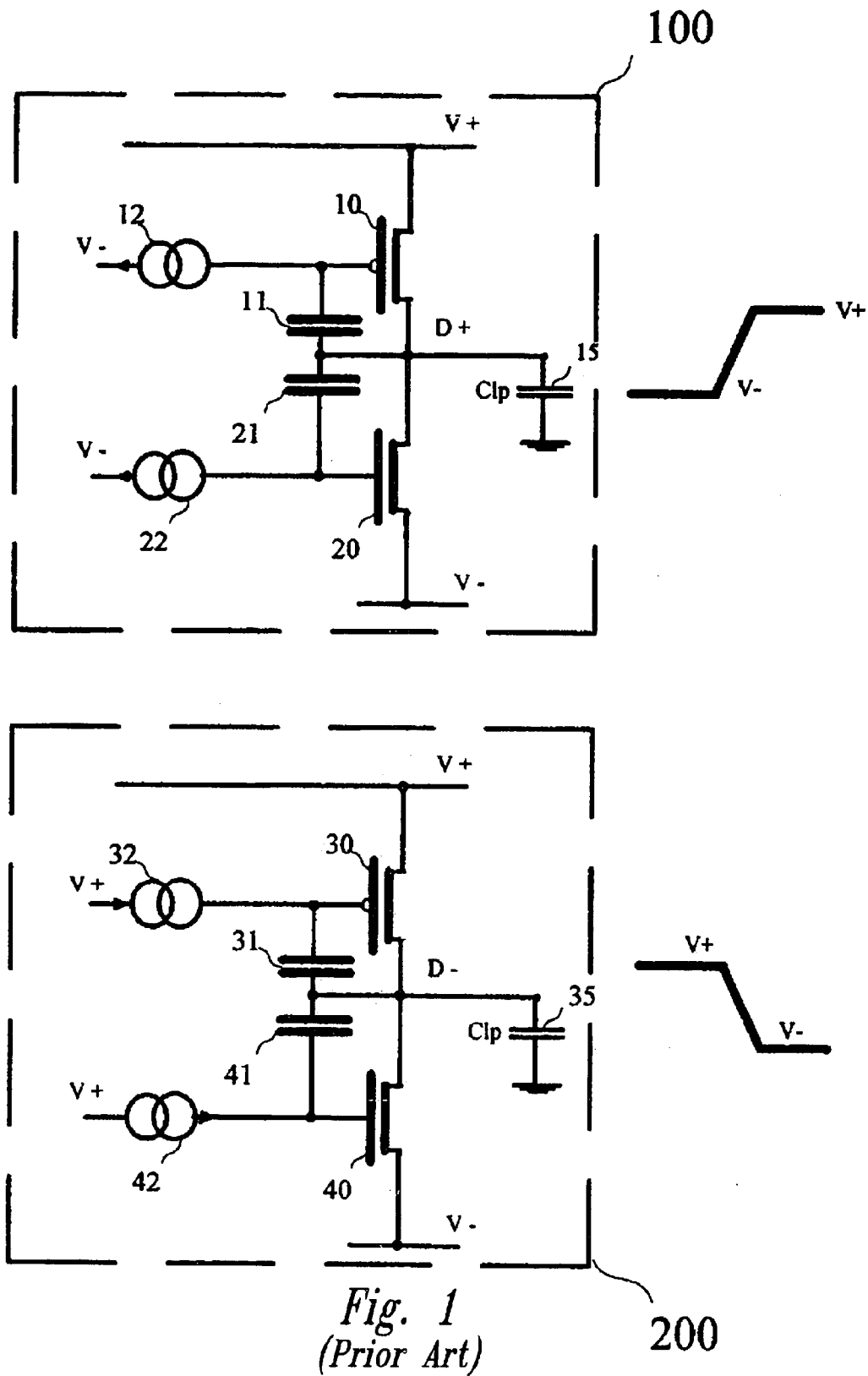
FIG. 1 illustrates the structure of a driver or control circuit known in the art.
Figure 2:
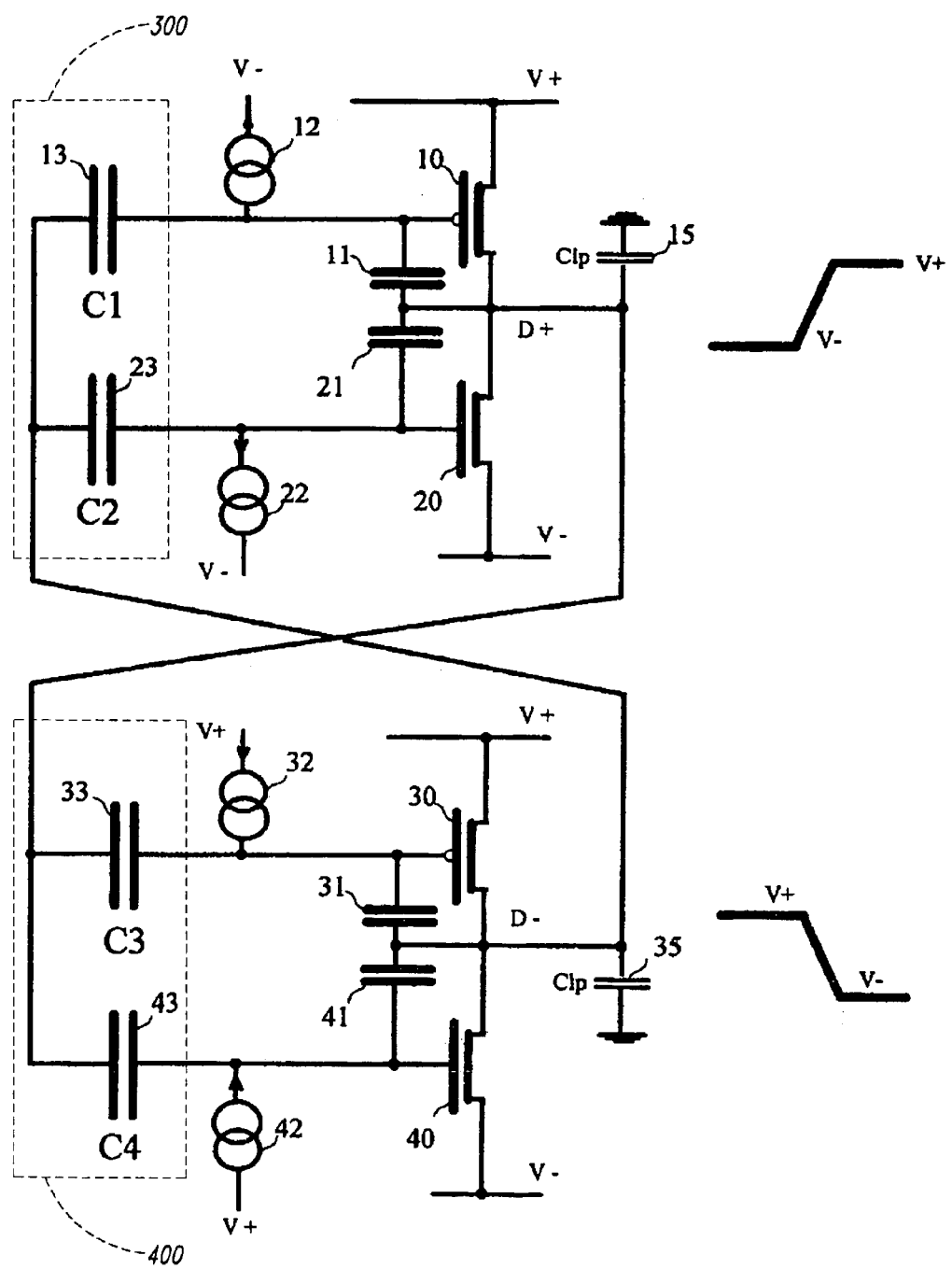
FIG. 2 illustrates a control circuit as improved by the teachings of this invention.

When examining in detail the structure shown in FIG. 2, it can be seen that the first circuit is composed of a first PMOS transistor 10 that receives a positive supply voltage V+ via its source electrode and has its drain electrode connected to the output electrode D+ of the bus control circuit. A NMOS transistor 20 of opposite polarity has a drain electrode connected to the output electrode D+ and a source electrode connected to a negative reference potential V−. The gates of transistors 10 and 20 are controlled by a power source, respectively a first source 12 and a second source 22 supplied with voltage V−. A first coupling capacitor 11 is connected between the gate and drain electrodes of PMOS transistor 10. In the same manner, a second coupling capacitor is inserted between the gate of NMOS transistor 20 and its drain electrode. In the diagram of FIG. 2, it is assumed that the output electrode D+ is connected to a capacitive load 15 ($C_{LP}$), which is a relatively close representation of a typical load for a serial interface. It should be understood, however, that this representation is given for illustration purposes only and that the invention is not in any way limited thereto.

The second circuit is composed of a third transistor 30, of the same type as transistor 10, and that has a source electrode connected to the positive potential V+ and a drain electrode connected to the output electrode D−, that is loaded with a load 35, also supposed to be of a capacitive nature. A fourth transistor 40—of the same type as NMOS second transistor 20—has a drain electrode that is connected to the output electrode D− and a source electrode that is connected to the negative potential V−. Gates of transistors 30 and 40 are respectively controlled by a third power source 32 and a fourth power source 42 (V+) that are to receive the switching signal. As for the transistor pair 30 and 40, a third coupling capacitor 31 is inserted between the gate and drain electrodes of PMOS transistor 30, and a fourth coupling capacitor 41 between the gate and drain electrodes of NMOS transistor 40.

In order to compensate for internal characteristic differences of the transistor pairs 10–20 and 30–40, a new cross capacitive coupling is then advantageously realized between control circuits 100 and 200, especially by means of a set of four capacitors 13, 23, 33 and 43. The capacitors 13, 23 comprise a first coupling circuit 300, and capacitors 33 and 43 comprise a second coupling circuit 400. In the semiconductor manufacturing process, the first and second coupling circuits 300, 400 have process parameters that are more controllable than the process parameters for the transistor pairs 10–20 and 30–40.

More precisely, a first capacitor 13—having a value $C_1$—is inserted between the gate of first PMOS transistor 10 and the opposite output D− of the bus control circuit. Similarly, a second capacitor 23—having a value $C_2$—is inserted between the gate of second NMOS transistor 20 and the output D− of the other control circuit. Thus a first cross-capacitive coupling is realized between the gate inputs of transistors 10 and 20 and the output of the second bus control circuit formed by transistor pair 30–40.

In a symmetrical way, a second cross-capacitive coupling is realized between the inputs of the gates of transistors 30 and 40 and the output of the first circuit D+. For this purpose, a third capacitor 33, with a value $C_3$, is inserted between the gate of transistor 30 and the output D+, and a fourth capacitor 43, with a value $C_4$, is inserted between the gate of transistor 40 and the output D+. Supply sources 12, 22, 32 and 42, that drove transistors 10, 20, 30 and 40 respectively, remain unchanged.

As can be seen in FIG. 2, output potentials D+ and D− switch in opposite direction. Cross coupling capacitors 13, 23, 33 and 43 make it possible to feed back part of the information existing at the output of any of the control circuits—for example D+ at the output of the transistor pair 10–20—to modify the behavior of the transistor pair of the other circuit (30 and 40 in this case). If ever, because of internal characteristics of active components, one of the circuit switches more quickly than the other—for example the pair of transistors 10–20—the realized cross coupling substantially increases the switching speed of the opposite pair, thus reducing any variation between the switching times of the transistors.

With this cross-capacitive coupling, an effective compensation of the internal characteristics of the active components 10, 20, 30 and 40 that are so difficult to pair, can thus be achieved. Such compensation is carried out by pairing the passive components comprised of the four capacitors 13, 23, 33 and 43, which is more easy to realize regarding manufacturing processes.

More precisely, the values of capacitors $C_1$, $C_2$, $C_3$ and $C_4$ will be set according to the following formulas:

$$C_1 = K \times C_2$$

$$C_3 = C_1$$

$$C_4 = C_2$$

Where $K = I_{12}/I_{42}$ with $I_{12}$ and $I_{42}$ correspond respectively to the bias currents in power sources 12 and 42, respectively. People qualified in the art will be able to then adjust the value of capacitor $C_1$ (other values being then derived from the preceding formulas) so as to set values of the rise and decay times to the desired values. This adjustment of the values of the capacitors will provide substantially equal slew rates on the output signals D− and D+.

As can be seen, the invention makes it possible to substantially compensate for the differences existing between internal characteristics of transistors 10, 20, 30 and 40, by means of a simple adjustment of capacitor values. It will be noted that all known techniques for pairing the values of these capacitors 13, 23, 33 and 43 could advantageously be employed. Thus, people qualified in the art will be able to advantageously arrange capacitors 13, 23, 33 and 43 in capacitor arrays on the semiconductor element so as to avoid component mismatch effects, for example, resulting from diffusion gradients on the semiconductor element or physical layout differences.

Similarly, it is observed that control circuits driving the transistor gates can advantageously include known devices that are usually used in this type of structure. Thus, a power conservation circuit ensuring that two transistors do not conduct exactly at the same time can clearly be adapted thereto, as is conventionally done in such architectures.

As mentioned previously, the types of the transistors 10, 20, 30 and 40 can be changed. An interfacing circuit in which transistors 10 and 30 are NMOS-type transistors while transistors 20 and 40 are PMOS-type transistors can then be realized. Especially, the first transistor pair is realized with a NMOS-type first transistor, the source electrode of which is connected to a negative potential (V−) and the gate of which receives a control signal. The first pair further comprises a second transistor (a PMOS-type transistor) having a source electrode connected to a positive potential (V+). Both drain electrodes are connected together in order to provide the output electrode (D−) potential. A first (resp. a second) coupling capacitor is connected between the gate and the drain of the first (resp. second) transistor, respectively. Cross capacitive coupling is then realized by means of a first (second) capacitor that has one electrode connected to the output potential (D+) of the second control circuit and has a second electrode connected to the gate of the first (resp. second) transistor, respectively.

Similarly, the second circuit comprises an NMOS-type third transistor having a gate and having a source electrode connected to a negative potential (V−). The third transistor is serially mounted with a PMOS-type fourth transistor having a source electrode connected to a positive potential (V+) and having a common drain electrode with the third transistor, this common electrode being connected to the output potential (D+). A third output coupling capacitor is connected between the gate and drain of the third transistor and, in the same way, a fourth output coupling capacitor is connected between the gate and drain of the fourth transistor. Cross capacitive coupling is then realized by means of a third (resp. fourth) capacitor having an electrode connected to the output potential (D−) of the first control circuit and a second electrode that is connected to the gate of the third (resp. fourth) transistor, respectively.

From the foregoing it will be appreciated that, although specific embodiments of the invention have been described herein for purposes of illustration, various modifications may be made without deviating from the spirit and scope of the invention. Accordingly, the invention is not limited except as by the appended claims and the equivalents thereof.

What is claim is:

1. A bus control circuit comprising:
    a first circuit comprising a first pair of transistors of opposite types having a respective control electrodes and a first common electrode for providing a first output potential;
    a second circuit comprising a second pair of transistors of opposite types and having respective control electrodes and a second common electrode for providing a second output potential switching in opposite direction from the first output potential;
    first capacitive coupling means for feeding a portion of a signal existing at said first output potential back into said control electrodes of said second pair of transistors; and
    second capacitive coupling means for feeding a portion of a signal existing at said second output potential back into said control electrodes of said first pair of transistors, in order to compensate for a internal characteristics of the transistors and to standardize rise and decay times.

2. The bus control circuit according to claim 1 wherein the first circuit comprises:
    a PMOS-type first transistor having a gate, a source electrode arid a drain electrode, said source electrode being connected to a positive potential and said gate being controlled by a first control circuit;
    a NMOS-type second transistor having a gate, a source electrode and a drain electrode, said source electrode of the second transistor being connected to a negative potential and said gate of the second transistor being controlled by a second control circuit, said drain electrodes of said first and second transistors being connected to the first common electrode;
    a first output coupling capacitor connected between the gate and drain of said first transistor;
    a second output coupling capacitor connected between the gate and drain of said second transistor; and
    said gates of said first and second transistors being connected respectively to the second common electrode of the control circuit by means of a first and a second cross coupling capacitor.

3. The bus control circuit according to claim 2 wherein the second circuit comprises:
    a PMOS-type third transistor having a gate, a source electrode and a drain electrode, said source electrode of the third transistor being connected to a positive potential and said gate being controlled by a third control circuit;
    a NMOS-type fourth transistor having a gate, a source electrode and a drain electrode, said source electrode of the fourth transistor being connected to a negative potential and said gate of the fourth transistor being controlled by a fourth control circuit, said drain electrodes of said third and fourth transistors being connected to the second common output electrode switching in opposite direction from the first common electrode of said first and second transistors;
    a third output coupling capacitor connected between the gate and drain of said third transistor;
    a fourth output coupling capacitor connected between the gate and drain of said fourth transistor; and
    said gates of said third and fourth transistors being connected to the first common output electrode by means of a third and a fourth cross coupling capacitor, respectively.

4. The bus control circuit according to claim 3 wherein the first, second, third and fourth cross coupling capacitors respectively have values $C_1$, $C_2$, $C_3$ and $C_4$ having following relations:

$$C_1 = K \times C_2$$

$$C_3 = C_1$$

$$C_4 = C_2$$

where the K ratio is equal to the ratio of a bias currents of the power sources driving said first transistor and said fourth transistor respectively.

5. The bus control circuit according to claim 1 wherein the first circuit comprises:
a NMOS-type first transistor having a gate, a source electrode and a drain electrode, said source electrode being connected to a negative potential and said gate being controlled by a first control circuit;
a PMOS-type second transistor having a gate, a source electrode and a drain electrode, said source electrode of the second transistor being connected to a positive potential and said gate of the second transistor being controlled by a second control circuit, said drain electrodes of said first and second transistors being connected to the second common electrode;
a first output coupling capacitor connected between the gate and drain of said first transistor;
a second output coupling capacitor connected between the gate and drain of said second transistor; and
said gates of said first and second transistors being connected to the first common electrode by means of a first and a second cross coupling capacitor, respectively.

6. The bus control circuit according to claim 1 wherein the second circular comprises:
a NMOS-type third transistor having a gate, a source electrode and a drain electrode, said source electrode of the third transistor being connected to a negative potential and said gate of the third transistor being controlled by a third control circuit;
a PMOS-type fourth transistor having a gate, a source electrode and a drain electrode, said source electrode of the third transistor being connected to a positive potential and said gate of the third transistor being controlled by a fourth control circuit, said drain electrodes of said third and fourth transistors being connected to the first common electrode switching in opposite direction from the common electrode of said first and second transistors;
a third output coupling capacitor connected between the gate and drain of said third transistor;
a fourth output coupling capacitor connected between the gate and drain of said fourth transistor; and
said gates said third and fourth transistors being connected to the second common electrode by means of a third and a fourth coupling capacitor, respectively.

7. The bus control circuit according to claim 1 further comprises a device for avoiding simultaneous conduction of the transistors of the first and the second pairs in order to avoid power overdrain.

8. The bus control circuit according to claim 3 wherein said first, second, third and fourth cross coupling capacitors are realized by means of capacity arrays.

9. A driver circuit comprising:
a first buffer circuit having first and second control inputs and an output;
a second buffer circuit having first and second control inputs and an output;
first and second current sources coupled respectively to first and second control inputs of the first and second buffer circuits and structured to provide respective first and second bias currents;
a first coupling circuit including a first capacitor coupled between the first control input of the first buffer circuit and the output of the second buffer circuit and having a first capacitance value, and a second capacitor coupled to the second control input of the first buffer circuit and the output of the second buffer circuit and having a second capacitance value such that the respective capacitance values of the first and second capacitors are proportional to a ratio of the first and fourth bias currents; and
a second coupling circuit including a third capacitor coupled between the first control input of first buffer circuit and having a third capacitance value, and a fourth capacitor coupled to the second control input of the second buffer circuit and the output of the first buffer circuit and having a fourth capacitance value such that the respective capacitance values of the third and fourth capacitors are proportional to a ratio of the first and fourth bias currents.

10. The differential driver device according to claim 9 wherein the first and second buffer circuits further comprise first and second transistors having sources coupled to first and second respective supplies, and having respective drains coupled together to form the outputs of the respective buffer circuits.

11. The differential driver device according to claim 10 wherein the first and second buffer circuits further comprise first and second coupling capacitors coupled between a respective gate of the first and second transistors of the first and second buffer circuits and the output of the respective first and second buffer circuits.

12. A differential driver comprising:
first signal means for providing a first signal having a first slew rate and a first direction;
second signal means for providing a second signal having a second slew rate and a second direction;
feedback means for detecting the first and second slew rates; and
equalizing means for conditioning the first and second slew rates such that the first and second slew rates are substantially equal.

13. The differential driver according to claim 12 wherein the first direction of the first signal is opposite to the second direction of the second signal.

14. A method of controlling a slew rate of a signal comprising the steps of:
providing at an output of a first circuit, a first signal having a first slew rate;
providing at an output of a second circuit, a second signal having a second slew rate;
receiving the first signal at an input of the second circuit;
receiving the second signal at an input of the first circuit; and
equalizing the first and second slew rates.

15. The differential driver of claim 12 wherein the equalizing means includes first and second equalizing blocks respectively connected to respective inputs of the first and second signal means and the feedback means includes a first feedback line connected between an output of the first signal means and an input of the second equalizing block and a second feedback line connected between an output of the second signal means and an input of the first signal means.

16. The bus control circuit according to claim 12 wherein the first signal means comprises:
a PMOS-type first transistor having a gate, a source electrode and a drain electrode, said source electrode being connected to a positive potential and said gate being controlled by the equalizing means;

an NMOS-type second transistor having a gate, a source electrode and a drain electrode, said source electrode of the second transistor being connected to a negative potential and said gate of the second transistor being controlled by the equalizing means, said drain electrodes of said first and second transistors being connected together at an output of the first signal means;

a first output coupling capacitor connected between the gate and drain of said first transistor;

a second output coupling capacitor connected between the gate and drain of said second transistor; and said gates of said first and second transistors being connected respectively to the an output of the second signal means by the feedback means and the equalizing means.

17. The differential driver of claim 12 wherein the equalizing means includes:

first capacitive coupling means, connected to an output of the first signal means, for feeding a portion of the first signal into a control input of the second signal means; and second capacitive coupling means, connected to an output of the second signal means, for feeding a portion of the second signal into a control input of the first signal means.

18. The differential driver of claim 17 wherein the first capacitive coupling means includes first and second coupling capacitors connected respectively to first and second control inputs of the second signal means and the second capacitive coupling means includes third and fourth coupling capacitors connected respectively to first and second control inputs of the first signal means.

19. The differential driver of claim 18 wherein the first, second, third and fourth coupling capacitors respectively have values $C_1$, $C_2$, $C_3$ and $C_4$ having following relations:

$$C_1 = K \times C_2$$

$$C_3 = C_1$$

$$C_4 = C_2$$

where K is equal to a ratio of bias currents of the power sources driving the first and second signal means, respectively.

20. The differential driver of claim 18 wherein said first, second, third and fourth coupling capacitors are realized by capacitor arrays.

* * * * *

UNITED STATES PATENT AND TRADEMARK OFFICE
CERTIFICATE OF CORRECTION

PATENT NO. : 6,798,235 B2 Page 1 of 1
DATED : September 28, 2004
INVENTOR(S) : Joel Caranana It is certified that error appears in the above-identified patent and that said Letters Patent is hereby corrected as shown below:

Column 6,
Lines 17 and 18, "source electrode arid a drain electrode," should read as -- source electrode and a drain electrode, --.

Column 7,
Line 30, "second circular comprises:" should read as -- second circuit comprises: --.

Signed and Sealed this

Twenty-third Day of August, 2005

JON W. DUDAS
*Director of the United States Patent and Trademark Office*